United States Patent
Brennan et al.

(10) Patent No.: US 6,246,120 B1
(45) Date of Patent: Jun. 12, 2001

(54) SIDEWALLS FOR GUIDING THE VIA ETCH

(75) Inventors: Kenneth D. Brennan, Flower Mound; David B. Aldrich, Allen; Eden M. Zielinski, Rowlett; Peter S. McAnally, McKinney, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/401,964

(22) Filed: Sep. 22, 1999

Related U.S. Application Data

(62) Division of application No. 09/061,320, filed on Apr. 16, 1998, now Pat. No. 6,074,943.
(60) Provisional application No. 60/043,189, filed on Apr. 16, 1997.

(51) Int. Cl.[7] .................................................. H01L 23/48
(52) U.S. Cl. ........................................... 257/774; 257/758
(58) Field of Search ..................... 438/183, 184, 438/636–640, 670, 673, 740; 257/774, 775, 776, 758

(56) References Cited

U.S. PATENT DOCUMENTS

| | | | |
|---|---|---|---|
| 5,321,211 | * 6/1994 | Haslam et al. | 174/262 |
| 5,462,893 | * 10/1995 | Matsuoka et al. | 438/638 |
| 5,619,072 | * 4/1997 | Mehta | 257/774 |
| 5,641,708 | * 6/1997 | Sardella et al. | 438/592 |
| 5,702,981 | * 12/1997 | Maniar et al. | 438/267 |
| 5,756,396 | * 5/1998 | Lee et al. | 438/622 |
| 5,808,364 | * 9/1998 | Cronin et al. | 257/774 |
| 5,827,437 | * 10/1998 | Yang | 216/77 |
| 5,852,328 | * 12/1998 | Nishimura et al. | 257/774 |
| 5,969,425 | * 10/1999 | Chen et al. | 257/774 |
| 6,023,083 | * 2/2000 | Tomita | 257/296 |
| 6,037,630 | * 3/2000 | Igarashi et al. | 257/336 |

* cited by examiner

Primary Examiner—Carl Whitehead, Jr.
Assistant Examiner—Jeff Vockrodt
(74) Attorney, Agent, or Firm—Mark A. Valetti; Wade James Brady, III; Frederick J. Telecky, Jr.

(57) ABSTRACT

A structure and method to direct the via 270 etch to the top of the interconnect 210, by using a sidewall layer 240, preferably. TiN, and thus preventing the etching down the side of the interconnect 210 and exposure of materials residing between the interconnects 210.

9 Claims, 3 Drawing Sheets

SIDEWALLS FOR GUIDING THE VIA ETCH

CROSS REFERENCE TO PRIOR APPLICATIONS

This application is a division of Ser. No. 09/061,320, filed Apr. 16, 1998, now U.S. Pat. No. 6,074,943, which claims priority under 35 U.S.C. 119 based upon Provisional Application Ser. No. 60/043,189, filed Apr. 16, 1997.

BACKGROUND AND SUMMARY OF THE INVENTION

The present invention relates to interconnect structures and fabrication methods.

Background: Via Alignment

As device dimensions shrink, the margin between the edges of vias and the edges of interconnects decreases. If a via is patterned such that it does not completely overlie an interconnect, the material along the side of the interconnect may undesirably be removed during the via etch, resulting in an increase in contact resistance. Also, there may be materials between the interconnects, which if exposed during via etch, can cause problems during the filling of the vias, such as via poisoning. The occurrence of via misalignment increases in "zero-overlap" via/interconnect designs, in which the area of the interconnect equals the area of the via.

One conventional approach selects the dielectric material such that the via etch preferentially etches the portion of the dielectric which is on top of the interconnects. In addition, a liner layer is typically used over the interconnects to serve as a buffer layer to subsequently deposited dielectrics by gettering impurities from the sides of the interconnects. However, the buffer layer is usually a dielectric material, such as silicon oxide or PETEOS, which may not be conformally deposited.

Another conventional technique for ensuring that a reliable contact will still be made in the event of an error in contact via placement is to form a thick buffer region 320, which can be composed of a dielectric, conductive nitride, polysilicon, or metal, on the sidewalls of the interconnect 310 to serve as an etch stop in order to protect the underlying layer 300, as shown in prior art FIG. 3. This conventional technique is discussed in U.S. Pat. No. 5,321,211 to Haslam et al., which is hereby incorporated by reference. However, with this structure, the via hole must fall entirely on top of the interconnect/buffer area in order to protect the underlying layers.

Sidewall Structures and Methods

The present application discloses structures and methods for guiding the via etch by depositing a thin sidewall layer, preferably titanium nitride (TiN), on the interconnects. Parallel extensions of this thin side layer of TiN above the surface of the interconnect can direct the via etch to the top of the interconnect, and thus prevent etching down the side of the interconnect and exposure of materials residing between the interconnects. Unlike the Haslam et al. patent, which requires the via etch to fall entirely on the interconnect/buffer area, the present inventors have discovered that the use of parallel extensions of a thin sidewall layer allows the via etch to miss the interconnect/sidewall area by up to twenty-five percent of the via diameter.

Advantages of the disclosed methods and structures include:

simple and effective method to etch aluminum interconnects;

increases back-end-of-line yield by saving misaligned vias;

lowers the resistance and improves the reliability of "zero-overlap" vias;

thickness of the sidewall material can be minimized because of the conformal nature of the deposition; and a wider range of dielectric materials can be integrated into structures, without the need for a PETEOS liner layer.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Sample Structural Embodiment: Via Etch Guide

Figure 1:
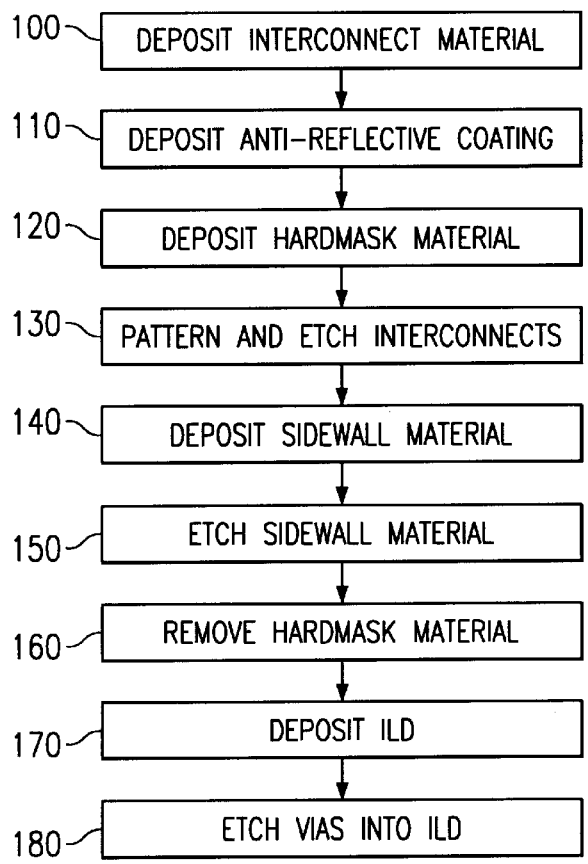
FIG. 1 shows a process flow for fabricating via structures using parallel extensions of sidewall layers on underlying interconnects.
Figure 2A:
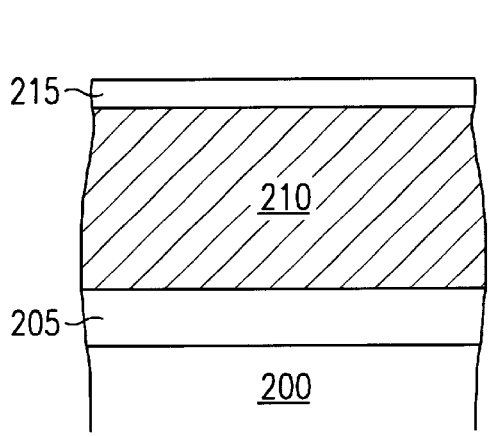
FIGS. 2A–2H show the formation of vias using embodiments of the present invention.

As described in the process flow of FIG. 1 and shown in FIGS. 2A–2H, vias can be etched into the dielectric material to contact to the underlying interconnect without exposing materials residing between the interconnects. First, the interconnect material 210 (e.g. Al-Cu, with 0.1 to 5 percent copper, having a thickness around 200 nm) is deposited (step 100) over an oxide layer 200. Optionally, a barrier and adhesion layer 205 (e.g. 30 nm of TiN on 30 nm of titanium) can be used to separate the oxide substrate 200 from the metal interconnect material 210. Subsequently, a 30 nm anti-reflective coating layer 215 (e.g. TiN) can be deposited (step 110) over the metal layer, as can be seen in FIG. 2A.

Figure 2B:
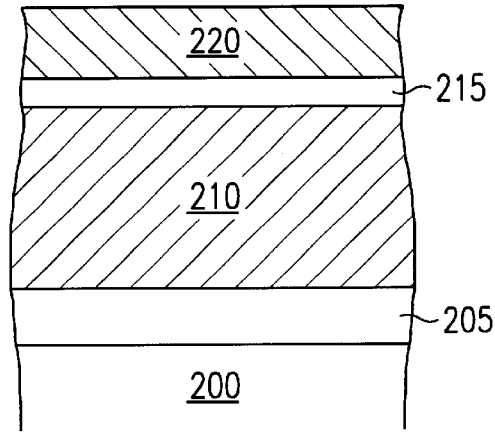
Figure 2C:
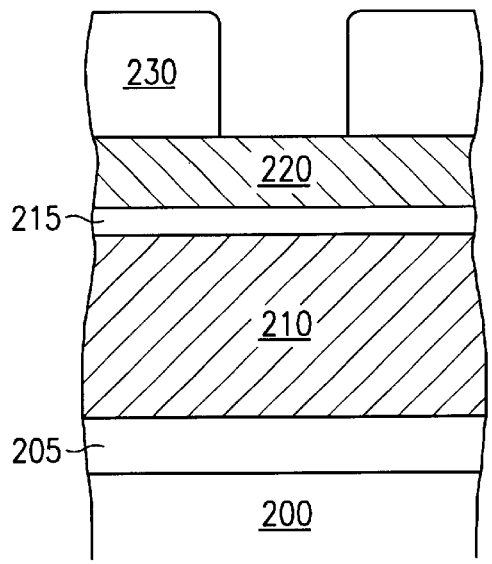
Figure 2D:
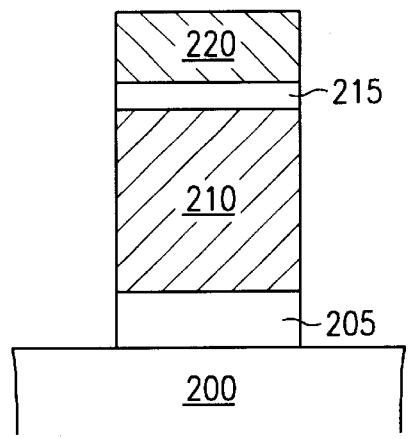

Thereafter, as shown in FIG. 2B, the hardmask material 220 (e.g. PETEOS), with a thickness of approximately 100 nm, is deposited (step 120) on the interconnect material 210, followed by patterning with a photoresist 230 (e.g. by using a fluorine-based chemistry), and etching of the interconnects (step 130), using a chlorine-based chemistry, to form the interconnects, which is illustrated in the cross-sectional views of FIGS. 2C and 2D.

Figure 2E:
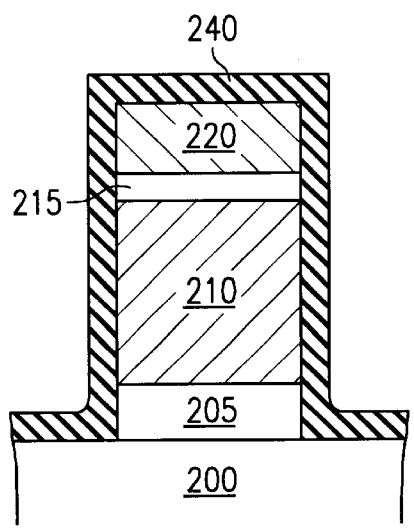
Figure 2F:
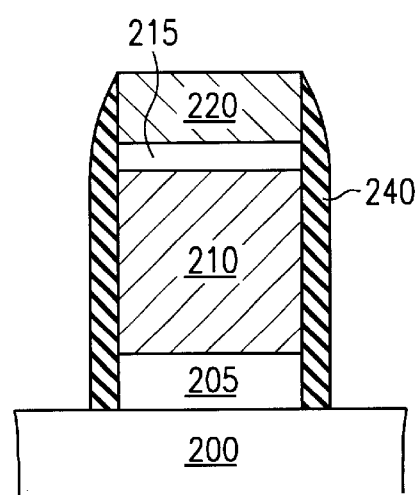

A layer of sidewall material 240 is then deposited (step 140), using, for example, a chemical vapor deposition (CVD) process, on the interconnects, followed by the etch-back of the sidewall material 240 (step 150), using a chlorine-based chemistry, to leave only a thin layer (e.g. 10–50 nm) of sidewall material 240 on the sides of the interconnect material 210, the hardmask layer 220 and the anti-reflective coating 215, as shown in FIGS. 2E and 2F. Thereafter, the hardmask material 220 is removed (step 160)

(e.g. by ashing using wet oxygen) and an interlevel dielectric layer 250 (ILD) (e.g. TEOS-derived SiO2) is blanket deposited (step 170) over the interconnects.

Figure 2G:
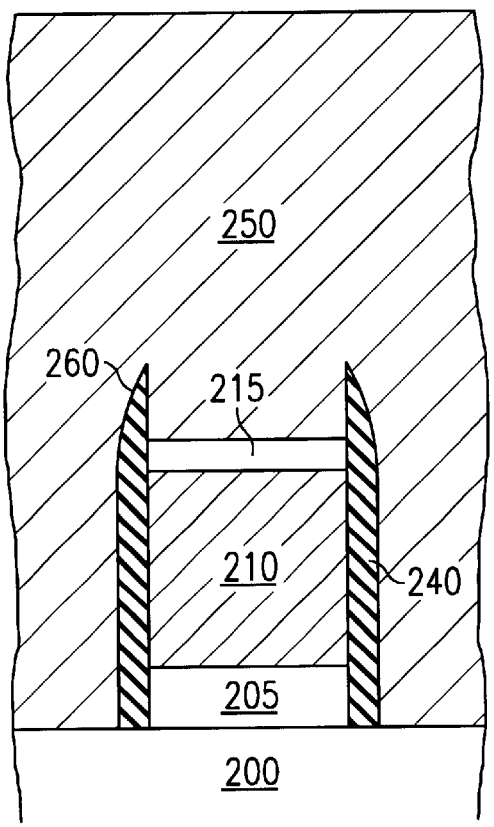
Figure 2H:
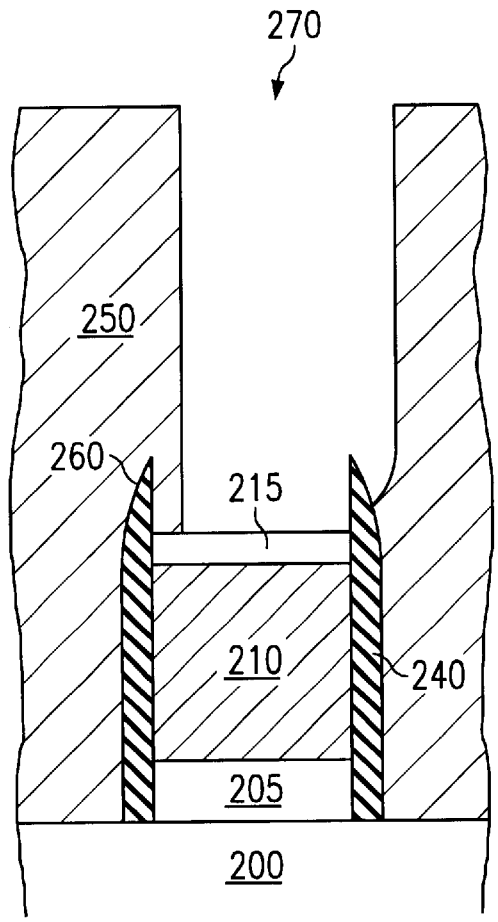
Figure 3:
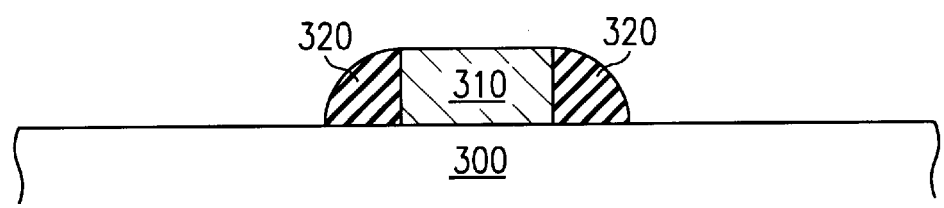
FIG. 3 shows a prior art interconnect structure with thick buffer regions on the sidewalls.

The sidewall material that remains after the etching of the hardmask can advantageously be used as a via "guide". After the ILD 250 deposition is complete, the sidewall material 240 will jut up into the ILD 250, forming sidewall extensions 260, as schematically illustrated in FIG. 2G. Subsequently, vias 270 can be etched (step 180) in the dielectric 250 to contact to the underlying interconnects. Due to the sensitivity of the via etch to the size of the hole (smaller holes etch slower), etching outside of the extensions 260 of the sidewall material 240 occurs at a much slower rate (and eventually stops) than etching inside of the extensions 260. Thus, the sidewall extensions 260 can direct the subsequent via 270 etch (step 180) to the top of the interconnects to prevent etching down the side of the interconnect and exposure of materials residing between the interconnects, as shown in FIG. 2H. The use of extensions 260 of sidewall material 240 can correct the via etch (step 180) for via misalignment up to twenty percent, and possibly up to twenty-five percent, of the via diameter.

The sidewall extensions 260 can advantageously be compatible with the integration of many different dielectric materials, some of which would not meet the etch selectivity criteria of conventional methods of aligning vias, and/or would require the use of a PETEOS liner layer to getter impurities from the sides of the interconnects. For example, dielectrics that can now be used without a liner layer include: xerogels, air gaps, porous oxides, or other materials associated with via poisoning, which is caused by the outgassing of the dielectric (e.g. SOG (spin-on glass), organics, or hydrogen silsesquioxane) during subsequent metal (e.g. aluminum) deposition, resulting in poor step coverage of the aluminum.

The following table gives results from actual test runs using preferred embodiments of the present invention. The test structures included the following layers: 30 nm TiN (hardmask), 560 nm Al-Cu, with 0.5 percent copper, 30 nm TiN, and 30 nm Ti. After the metal interconnect etch, 10 nm of CVD TiN was deposited over the interconnects. The metal interconnect and TiN sidewall etches were performed in a Lam 9600 TCP.

TABLE

Aluminum Interconnect Etch

Initial Break-Through Step

| | |
|---|---|
| Top Power: | 350 W |
| Bottom Power: | 300 W |
| Pressure: | 14 mT |
| Cl2 Flow: | 50 sccm |
| BCl3 Flow: | 50 sccm |
| He Backside Pressure: | 10 T |
| Time: | 10 sec |

Main Aluminum Etch

| | |
|---|---|
| Top Power: | 350 W |
| Bottom Power: | 1.50 W |
| Pressure: | 14 mT |
| Cl2 Flow: | 75 sccm |
| BCl3 Flow: | 35 sccm |
| He Backside Pressure: | 10 T |
| Time: | 55 sec |

Over-etch

| | |
|---|---|
| Top Power: | 250 W |
| Bottom Power: | 180 W |

TABLE-continued

| | |
|---|---|
| Pressure: | 14 mT |
| Cl2 Flow: | 60 sccm |
| BCl3 Flow: | 40 sccm |
| He Backside Pressure: | 10 T |
| Time: | 70 sec |

TiN Sidewall Etch

One-Step Etch

| | |
|---|---|
| Top Power: | 200 W |
| Bottom Power: | 200 W |
| Pressure: | 12 mT |
| Cl2 Flow: | 20 sccm |
| BCl3 Flow: | 30 sccm |
| He Backside Pressure: | 3 T |
| Time: | 15 sec |

The following table compares the resistance of vias formed with and without sidewall extensions, depending on the via/interconnect overlap. As can be seen, for the baseline process (without the sidewall extensions), the standard deviation (SD) from the Mean values are higher than for the processes using sidewall extensions. The higher values (measured in ohms/stitch, which includes the metal link resistance, but the via resistance dominates) of the baseline processes are due to a significant number of "outliers" (areas etched outside the interconnects). However, the TiN sidewalls prevent the occurrence of "outliers," which is shown by the small variation in Mean and SD for the four sidewall test structures.

TABLE

| | Baseline | TiN Sidewalls | | | |
|---|---|---|---|---|---|
| Overlap (microns) | Mean (SD) | Mean (SD) | Mean (SD) | Mean (SD | Mean (SD) |
| 22 | 4.2 | 4.2 | 4.2 | 4.3 | 4.2 |
| | (7.7) | (0.8) | (0.9) | (1.3) | (1.0) |
| 14 | 5.4 | 5.5 | 5.5 | 5.8 | 5.7 |
| 7.5 | 6.9 | 7.7 | 7.6 | 7.6 | |
| 5 | 14.5 | 11.0 | 10.7 | 9.4 | 12.4 |
| | (57.5) | (2.6) | (2.8) | (4.7) | (3.5) |
| 0 | 8.7 | 9.8 | 10.1 | 6.6 | 17.8 |
| | (38.0) | (6.5) | (9.1) | (5.6) | (6.5) |

Alternate Sidewall Material Embodiment: TiAlN

Alternatively, a layer of TiAlN can be deposited over the interconnects, and etched to form the sidewall material. After the removal of the hardmask layer, extensions of the TiAlN sidewall material can "guide" the subsequent via etch.

Alternate Sidewall Material Embodiment: Layered Sidewalls

Alternatively, the sidewall material can consist of a layered structure, such as a layer of TiAlN deposited over a layer of TiN. After the removal of the hardmask layer, extensions of the layered sidewall material can "guide" the subsequent via etch.

Alternate Sidewall Material Embodiment: Metal Sidewalls

By using a layer of sidewall material, the sides of the interconnect are encapsulated. Therefore, the sidewall material can alternatively be a metal, such as titanium, which provides a diffusion barrier function and also a gettering function. Such a metal sidewall functions as a diffusion barrier and can also provide improved protection for the interconnects.

In further alternative embodiments, the sidewall material can alternatively be another metal (e.g. copper, tantalum, molybdenum, zirconium, hafnium, chromium, palladium, or nickel) instead of the conductive nitrides of the preferred embodiment.

Alternate Sidewall Deposition Embodiment: ECVD

Alternatively, the sidewall material can be deposited by an ECVD process. (ECVD TiN films are CVD TiN films which have been plasma treated in hydrogen and nitrogen to density the film and decrease the carbon content.) Deposition of TiN by ECVD allows for thinner sidewall layers. Thus, there is more room between the metal lines which can be filled with alternative materials, such as low-k dielectrics.

Alternate Hardmask Embodiment: Titanium/TiN

Alternatively, a layer of titanium can be deposited over the TiN anti-reflective coating layer 215 to provide selectivity during the etchback of the sidewall material (e.g. TiN).

Alternate Hardmask Embodiment: Silicon Nitride

Alternatively, a layer of silicon nitride can be used as the hardmask material to provide an etch stop to protect the top of the metal layer during the etchback of the sidewall material.

Alternate Hardmask Embodiment: Non-Removed Oxide

Alternatively, a layer of oxide, which can have a different composition than the interlevel dielectric layer 250, can be used as the hardmask material 220 to provide an etch stop to protect the top of the metal layer during the etchback of the sidewall material. Advantageously, the oxide 220 does not have to be removed prior to the interlevel dielectric deposition. During the via etch, the oxide 220 on top of the interconnects will be removed, while the sidewall material prevents etching down the sides of the interconnect.

Alternate ARC Layer Embodiment: TiW

Alternatively, a layer of TiW can be used as the anti-reflective coating layer.

Alternate Interconnect Material Embodiment: Copper

In an alternative embodiment, the metal interconnects 210 can consist essentially of copper.

Alternate Barrier/Adhesion Layer Embodiment: Titanium over TiN

Alternatively, a layer of titanium, which serves as the adhesion layer can be deposited over the TiN barrier layer 205 to separate the oxide substrate from the metal interconnects.

Alternate Barrier Layer Embodiment: TiAlN

Alternatively, a layer of TiAlN can be deposited prior to the interconnect material to serve as a barrier layer 205.

Alternate Barrier Layer Embodiment: TiSiN

Alternatively, a layer of TiSiN can be deposited prior to the interconnect material to serve as a barrier layer 205.

According to a disclosed class of innovative embodiments, there is provided: An integrated circuit interconnect structure, comprising: a patterned metal layer having sidewalls and a top surface; wherein at least some of said sidewalls, but not said top surface, of said metal layer have a thin layer of conductive material thereon, said conductive material having extensions above said top surface of said metal layer; and a layer of dielectric material overlying said metal layer; wherein said dielectric material has vias formed therein; wherein some parts of said vias have vertical sidewalls which do not overlie any portion of said metal nor said extensions of said conductive material; whereby etching down said sidewalls of said metal layer is inhibited.

According to another disclosed class of innovative embodiments, there is provided: An integrated circuit interconnect structure, comprising: a patterned metal layer having sidewalls and a top surface; wherein at least some of said sidewalls, but not said top surface, of said metal layer have a thin layer of conductive material, but no other barrier layer, thereon, said conductive material having extensions above said top surface of said metal layer; and a layer of dielectric material which is capable of via poisoning overlying said metal layer; wherein said dielectric material has vias formed therein which overlie said extensions of said conductive material; whereby outgassing of said dielectric material into said vias during etching is inhibited.

According to another disclosed class of innovative embodiments, there is provided: A method of fabricating an integrated circuit structure, comprising the steps of: (a.) depositing a thin layer of conductive material onto at least some sidewalls of a patterned metal layer and onto at least some sidewalls of a patterned hardmask layer, forming extensions of said conductive material above the top of said metal layer; (b.) depositing a blanket layer of dielectric material; and (c.) etching said dielectric material to form vias therein; wherein some parts of said vias have vertical sidewalls which do not overlie any portion of said metal nor said extensions of said conductive material; whereby etching down said sidewalls of said metal layer is inhibited.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should be noted that the number of layers of metallization described above does not implicitly limit any of the claims, which can be applied to processes and structures with more or fewer layers.

Of course, a wide variety of materials, and of combinations of materials, can be used to implement the metal layer. In addition, other barrier layers (e.g. WSiN, TaSiN, TiWN, WN, CrN, and CrAlN) can be used to separate the interconnect material from the oxide substrate.

Furthermore, the hardmask layer can be composed of any dielectric that is resistant to the metal interconnect etch chemistry. Silicon oxynitride can also optionally be substituted where silicon nitride is used in the embodiments.

Of course, the specific etch chemistries, layer compositions, and layer thicknesses given are merely illustrative, and do not by any means delimit the scope of the claimed inventions.

The invention can also be adapted to other combinations of dielectric materials in the interlevel dielectric. For example, phosphosilicates, germanosilicate, borophosphosilicates, arsenosilicates or combinations thereof can be used instead of the TEOS derived SiO2 of the presently preferred embodiment.

What is claimed is:

1. An integrated circuit interconnect structure, comprising:
    first patterned electrically conductive material having opposing sidewalls and an exposed top surface;
    a second layer of electrically conductive material on at least some of said sidewalls, and not on said top surface, said second layer of electrically conductive material extending above said exposed top surface of said first patterned electrically conductive material; and
    a layer of dielectric material overlying said first patterned electrically conductive material having a via therein;

parts of said via having vertical side walls which do not overlie any portion of said first patterned electrically conductive material or said extensions of said conductive material to inhibit etching down of said sidewall of said metal layer.

2. The integrated circuit of claim 1, wherein said metal layer consists essentially of aluminum.

3. The integrated circuit of claim 1, wherein said conductive material is titanium nitride.

4. An integrated circuit interconnect structure, comprising:
   a patterned electrically conductive metal layer having sidewalls and a top surface;
   a layer of electrically conductive material on at least some of said sidewalls, but not said top surface and no barrier layer, thereon, said conductive material having extensions above said top surface of said metal layer; and
   a layer of dielectric material which is capable of via poisoning overlying said metal layer having vias therein which overlie said extensions of said conductive material to inhibit outgassing of said dielectric material into said vias during etching.

5. The integrated circuit of claim 4, wherein said metal layer consists essentially of aluminum.

6. The integrated circuit of claim 4, wherein said conductive material is titanium nitride.

7. An integrated circuit structure, comprising:
   a patterned electrically conductive layer having a first pair of opposing sidewall portions;
   a first layer of dielectric material over said electrically conductive layer having a second pair of sidewall portions extending from said first pair of sidewall portions;
   a layer of electrically conductive material on said first and second pairs of sidewall portions providing extensions of said electrically conductive material extending above the portion of said electrically conductive layer most closely adjacent to said first layer of dielectric material;
   a second layer of dielectric material over said first layer of dielectric material; and
   a via extending through said first and second layers of dielectric material extending to said electrically conductive layer and, when misaligned, extending to said layer of electrically conductive material to inhibit etching down said sidewalls of said metal layer.

8. The integrated circuit of claim 7 wherein said metal layer consists essentially of aluminum.

9. The integrated circuit of claim 7 wherein said conductive material is titanium nitride.

* * * * *